(12) United States Patent
Brick et al.

(10) Patent No.: US 8,179,940 B2
(45) Date of Patent: May 15, 2012

(54) SEMICONDUCTOR LASER AND METHOD FOR PRODUCING THE SEMICONDUCTOR LASER

(75) Inventors: Peter Brick, Regensburg (DE); Wolfgang Schmid, Deuerling/Hillohe (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 155 days.

(21) Appl. No.: 12/240,601

(22) Filed: Sep. 29, 2008

(65) Prior Publication Data
US 2009/0097519 A1 Apr. 16, 2009

(30) Foreign Application Priority Data

Sep. 28, 2007 (DE) .................... 10 2007 046 518
Dec. 21, 2007 (DE) .................... 10 2007 062 050

(51) Int. Cl.
*H01S 5/00* (2006.01)
(52) U.S. Cl. ............. 372/44.01; 372/49.01; 372/50.124; 372/50.21
(58) Field of Classification Search ................ 372/44.01
See application file for complete search history.

(56) References Cited

U.S. PATENT DOCUMENTS

| | | | |
|---|---|---|---|
| 4,378,255 A | 3/1983 | Holonyak, Jr. et al. | |
| 4,633,476 A * | 12/1986 | Scifres et al. ............. | 372/45.01 |
| 4,653,058 A * | 3/1987 | Akiba et al. ............... | 372/50.11 |
| 4,830,983 A | 5/1989 | Thornton | |
| 4,871,690 A | 10/1989 | Holonyak, Jr. et al. | |
| 4,894,840 A * | 1/1990 | Liau et al. ................ | 372/108 |
| 5,016,252 A | 5/1991 | Hamada et al. | |
| 5,020,068 A | 5/1991 | Isshiki | |
| 5,023,199 A | 6/1991 | Murakami et al. | |
| 5,171,707 A | 12/1992 | Takahashi | |
| 5,212,706 A | 5/1993 | Jain | |
| 5,216,684 A | 6/1993 | Wang et al. | |
| 5,285,466 A | 2/1994 | Tabatabaie | |
| 5,317,586 A | 5/1994 | Thornton et al. | |
| 5,469,457 A | 11/1995 | Nagai et al. | |
| 5,508,225 A | 4/1996 | Kadoiwa | |
| 5,619,519 A | 4/1997 | Hamada et al. | |

(Continued)

FOREIGN PATENT DOCUMENTS

DE 40 10 133 10/1990

(Continued)

OTHER PUBLICATIONS

C.P. Chao et al., "Low-Threshold, High Power, 1.3-μm Wavelength, InGaAsP-InP Etched-Facet Folded-Cavity Surface-Emitting Lasers", IEEE Photonics Technology Letters, vol. 7, No. 8, pp. 836-838, Aug. 1995.

(Continued)

*Primary Examiner* — Jessica Stultz
*Assistant Examiner* — Xnning Niu
(74) *Attorney, Agent, or Firm* — Cozen O'Connor

(57) ABSTRACT

A semiconductor laser is embodied as a surface emitting thin-film semiconductor laser (2) with a semiconductor body (4). The semiconductor body (4) comprises a first and a second planar surface (12, 14). The semiconductor body (4) comprises between the planar surfaces at least one active layer (10) for generating radiation. The semiconductor body (4) has, for coupling out the radiation from the active layer (10) toward the first planar surface (12), at least one first mirror area (26) inclined with respect to the active layer (10).

20 Claims, 9 Drawing Sheets

U.S. PATENT DOCUMENTS

| | | | |
|---|---|---|---|
| 5,629,954 A | 5/1997 | Jansen et al. | |
| 5,636,236 A | 6/1997 | Tada et al. | |
| 5,668,049 A | 9/1997 | Chakrabarti et al. | |
| 5,696,023 A | 12/1997 | Holonyak, Jr. et al. | |
| 5,703,894 A | 12/1997 | Valster et al. | |
| 5,717,707 A | 2/1998 | Beernink et al. | |
| 5,757,835 A | 5/1998 | Ono et al. | |
| 5,923,689 A | 7/1999 | Su et al. | |
| 6,008,525 A | 12/1999 | Barron et al. | |
| 6,274,891 B1 | 8/2001 | Tanaka et al. | |
| 6,323,052 B1 | 11/2001 | Horie et al. | |
| 6,396,862 B1* | 5/2002 | Wang et al. | 372/46.01 |
| 6,487,225 B2 | 11/2002 | Okubo | |
| 6,518,159 B1 | 2/2003 | Tsunoda | |
| 6,556,610 B1 | 4/2003 | Jiang et al. | |
| 6,611,544 B1 | 8/2003 | Jiang et al. | |
| 6,618,409 B1 | 9/2003 | Hu et al. | |
| 6,625,190 B1 | 9/2003 | Hayakawa et al. | |
| 6,677,618 B1 | 1/2004 | Horie et al. | |
| 6,744,074 B2 | 6/2004 | Horie et al. | |
| 6,888,868 B2 | 5/2005 | Lim et al. | |
| 6,999,488 B2 | 2/2006 | Tsunoda | |
| 7,033,852 B2 | 4/2006 | Hausler et al. | |
| 7,338,821 B2 | 3/2008 | Ressel et al. | |
| 2001/0006528 A1* | 7/2001 | Sato et al. | 372/46 |
| 2002/0003824 A1 | 1/2002 | Lo et al. | |
| 2002/0154664 A1* | 10/2002 | Okubo | 372/45 |
| 2004/0032893 A1 | 2/2004 | Hausler et al. | |
| 2005/0123016 A1 | 6/2005 | Behfar et al. | |
| 2005/0287693 A1 | 12/2005 | Ressel et al. | |
| 2006/0091421 A1 | 5/2006 | Ono et al. | |
| 2006/0215719 A1* | 9/2006 | Charache et al. | 372/46.01 |
| 2006/0285566 A1* | 12/2006 | Ueki | 372/45.01 |
| 2007/0153867 A1 | 7/2007 | Muller | |

FOREIGN PATENT DOCUMENTS

| | | |
|---|---|---|
| DE | 100 48 475 | 4/2002 |
| DE | 102 21 952 | 11/2003 |
| DE | 10 2007 055 177 | 4/2009 |
| EP | 0 416 190 | 3/1991 |
| EP | 0 427 003 | 5/1991 |
| EP | 0 474 952 | 3/1992 |
| EP | 0 476 689 | 3/1992 |
| EP | 0 684 671 | 5/1995 |
| EP | 0 774 809 | 11/1996 |
| EP | 0 783 191 | 7/1997 |
| EP | 0 935 319 | 8/1999 |
| EP | 1 788 674 | 10/2006 |
| EP | 1 793 462 | 6/2007 |
| GB | 2 344 457 | 6/2000 |
| JP | 60-057990 | 4/1985 |
| JP | 60-083389 | 5/1985 |
| JP | 63-164386 | 7/1988 |
| JP | 63-278393 | 11/1988 |
| JP | 63-287084 | 11/1988 |
| JP | 63-289984 | 11/1988 |
| JP | 4-101486 | 4/1992 |
| JP | 6-005984 | 1/1994 |
| JP | 7-058401 | 3/1995 |
| JP | 7-242008 | 9/1995 |
| WO | WO 96/11503 | 4/1996 |
| WO | WO 01/33678 | 5/2001 |
| WO | WO 01/93385 | 12/2001 |
| WO | WO 2004/032292 | 4/2004 |

OTHER PUBLICATIONS

I. Schnitzer et al., "30% external quantum efficiency from surface textured, thin-film light-emitting diodes", Appl. Phys. Lett. 63, No. 18, pp. 2174-2176, Oct. 18, 1993.

"Vertically emitting laser with integrated non-absorbing mirror deflector", IBM Technical Disclosure Bulletin, vol. 32, No. 3B, 01.08.1989, pp. 498-499.

Jain, F. et al., "P-38: Monolithic Integration of Red, Blue, and Green Lasers for Smart Projection Displays", SID International Symposium digest of technical papers, vol. 26, May 1995, pp. 516-519.

Shin, J. et al., "Anomalous above-threshold spontaneous emission in gain-guided vertical-cavity surface-emitting lasers", Appl. Phys. Lett., vol. 68, No. 16, Apr. 15, 1996, pp. 2180-2182.

Kavanagh, K. L. et al., "Silicon diffusion at polycrystalline-Si/GaAs interfaces", Appl. Phys. Lett., vol. 47, No. 11, Dec. 1985, pp. 1208-1210.

Walker, C. et al., "Improved Catastrophic Optical Damage Level From Laser With Nonabsorbing Mirrors", IEEE Phototonics Technology Letters, vol. 14, No. 10, Oct. 2002, pp. 1394-1396.

* cited by examiner

SEMICONDUCTOR LASER AND METHOD FOR PRODUCING THE SEMICONDUCTOR LASER

RELATED APPLICATIONS

This patent application claims the priority of German patent application DE 10 2007 046 518.3 filed Sep. 28, 2007 and DE 10 2007 062 050.2 filed Dec. 21, 2007, the disclosure content of both of which is hereby incorporated by reference.

FIELD OF THE INVENTION

The invention relates to a semiconductor laser with a semiconductor body.

BACKGROUND OF THE INVENTION

In the case of an edge emitting semiconductor laser, radiation generated in an active layer of the semiconductor laser emerges from a semiconductor body of the edge emitting semiconductor laser in a direction parallel to the active layer. Since a semiconductor has a high refractive index, in principle, a large proportion of the emerging radiation is reflected back into the semiconductor body at the edge of the semiconductor laser, whereby the laser activity of the semiconductor laser is made possible. The reflection can be influenced by a surface coating of the edges of the semiconductor laser. For this purpose, the semiconductor laser has to be detached from a wafer assemblage in which a layer sequence of the semiconductor body is grown epitaxially. It is only then that the edges of the semiconductor laser are uncovered and their surface can be treated. Therefore, the surface treatment of the edges is in principle not carried out in the wafer assemblage. Furthermore, the edge emitting semiconductor lasers are in general not tested in the wafer assemblage.

Furthermore, in the case of the edge emitting semiconductor laser, the radiation emerges from the semiconductor body in an exit region at the active layer. Particularly in the case of a high intensity of the radiation and/or in the case of a long operating duration, this can promote wear, for example melting, of the active layer in the exit region. The melting is regularly referred to as COD (Catastrophic Optical Damage).

SUMMARY OF THE INVENTION

One object of the invention is to provide a semiconductor laser and a method for producing the semiconductor laser which contribute to the semiconductor laser being embodied as a surface emitting thin-film semiconductor laser, simple to produce and particularly durable.

This and other objects are attained in accordance with one aspect of the present invention directed to a semiconductor laser embodied as a surface emitting thin-film semiconductor laser with a semiconductor body. The semiconductor body comprises a first and a second planar surface. The semiconductor body comprises between the planar surfaces at least one active layer for generating radiation. The semiconductor body has, for coupling out the radiation from the active layer toward the first planar surface, at least one first mirror area inclined with respect to the active layer.

This makes it possible to process the first planar surface, at which the radiation emerges from the surface emitting thin-film semiconductor laser, in the wafer assemblage, for example to produce the mirror areas, to structure the surface emitting thin-film semiconductor lasers and/or to passivate the two planar surfaces or the mirror areas including a facet process. Furthermore, the surface emitting thin-film semiconductor lasers can be tested in the wafer assemblage. This contributes to a particularly simple and thus expedient production of the surface emitting thin-film semiconductor laser. Furthermore, this can contribute to influencing the reflection in an exit region of the radiation. Furthermore, the first mirror area can contribute to the effect that no COD occurs at the first planar surface. This contributes to the surface emitting thin-film semiconductor laser being particularly durable, for example in relation to wear, in particular melting, in particular in the case of a long operating duration and/or in the case of a high intensity of the radiation.

The first mirror area is formed by an outer area of the semiconductor body which is inclined with respect to the first and the second planar surface. A reflectance of the first mirror area can be increased by a dielectric and/or metallic surface being applied to the first mirror area. The first and, if appropriate, further mirror areas can be passivated, for example by removing oxygen atoms from their surface. The fact that the active layer is formed between the planar surfaces means, in this context, that the active layer, in a projection onto the planar surfaces, forms an overlap region with the planar surfaces.

In one configuration, the semiconductor body has, for coupling out radiation from the active layer toward the first planar surface, a second mirror area inclined with respect to the active layer. This enables the radiation to be coupled out from the active layer at different edges of the active layer by means of the mirror areas. This can contribute to a particularly high intensity of the radiation emitted by the surface emitting thin-film semiconductor laser and/or to a high efficiency of the surface emitting thin-film semiconductor laser. The second mirror area can be embodied in accordance with the first mirror area.

In a further configuration, at least one of the mirror areas is embodied in such a way that a main emission direction of the radiation emitted by the surface emitting thin-film semiconductor laser is perpendicular to the first planar surface of the semiconductor body. This can contribute to a particularly high radiation flow of the radiation emitted by the surface emitting thin-film semiconductor laser since perpendicular to the first planar surface within the semiconductor body the emerging radiation covers the smallest possible distance and thus interacts as little as possible with the semiconductor body.

In a further configuration, at least one of the mirror areas is inclined at an angle of 35 to 55 degrees with respect to the active layer. The angle is preferably 45 degrees. This makes it possible, in a simple manner, to embody the mirror areas in such a way that the main emission direction of the radiation emitted by the surface emitting thin-film semiconductor laser is perpendicular to the first planar surface of the semiconductor body.

In a further configuration, the semiconductor body has a thin-film layer sequence comprising the active layer. The thin-film layer sequence is preferably grown on a growth substrate and enables the active layer to be produced particularly precisely. Preferably, the thin-film layer sequence comprises at least two waveguide layers into which the active layer is embedded in a direction of an area normal of the layers. Furthermore, the waveguide layers and the active layer are embedded between at least two cladding layers in a direction of the area normal. The waveguide layers typically have a higher refractive index than the cladding layers, whereby a refractive index jump arises between the waveguide layers and the adjoining cladding layers. This brings about a guiding of the radiation in a lateral direction perpendicular to the area normal.

The semiconductors of the individual layers of the semiconductor body are preferably doped. By way of example, one of the cladding layers is n-doped, and the other is p-doped. The doped semiconductors enable a particularly high recombination rate of positive and negative charge carriers which recombine in the active layer and thus generate the radiation. The cladding layers can contribute to avoiding an undesirable flow of charge carriers and thus to increasing the recombination rate even further. Depending on the dopings, in order to generate the radiation a voltage is applied to the semiconductor body in such a way that preferably as many charge carriers as possible recombine in the active layer.

The additional expression "thin-film" in the surface emitting thin-film semiconductor laser means that the thin-film layer sequence can be for example thinner than 20 micrometers.

In a further configuration, the thin-film layer sequence comprises two or more active layers in which the radiation is generated and which are electrically coupled to one another by tunnel junctions monolithically integrated in the thin-film layer sequence. This makes it possible, in a simple manner, to increase a radiation flow generated in the thin-film layer sequence. The two or more active layers are preferably each embedded into their own waveguide layers and corresponding cladding layers. This gives rise, however, to pn or np junctions at differently doped cladding layers that adjoin one another. Depending on the applied voltage at the semiconductor body, the pn or np junctions are connected in series in the reverse direction. The tunnel junctions are formed between the differently doped cladding layers that adjoin one another, and enable a charge carrier flow via the junctions arranged in series for reverse-biasing.

In a further configuration, the semiconductor body comprises a functional layer. A side of the functional layer that is remote from the thin-film layer sequence forms the first planar surface of the semiconductor body. The functional layer can contribute to producing the thin-film layer sequence in a particularly simple manner. Furthermore, the functional layer can contribute to the fact that an electrode for making contact with the surface emitting thin-film semiconductor laser can have a relatively small area in comparison with the active layer and charge carrier recombination and hence generation of radiation can nevertheless take place in the entire active layer.

In a further configuration, the functional layer is narrower in a region in which a main radiation flow of radiation coupled out from the active layer occurs during operation of the surface emitting thin-film semiconductor laser then outside the region. This contributes, in a particular simple manner, to the intensity of the surface emitting thin-film semiconductor laser being particularly high since the radiation has to cover less distance within the semiconductor body and interacts with the semiconductor body to a lesser extent.

In a further configuration, the functional layer comprises a growth substrate. The growth substrate contributes to the fact that the thin-film layer sequence can be produced particularly precisely.

In a further configuration, the functional layer comprises a current spreading layer. The current spreading layer is distinguished by the fact that it has a particularly high electrical conductivity in a plane parallel to the active layer. This contributes to the fact that charge carriers induced to move by an externally applied voltage in the semiconductor body are distributed between the entire active layer and thus bring about charge carrier recombination in the entire active layer. This enables the electrode for applying the external voltage to be made relatively small in relation to the active layer.

In a further configuration, the semiconductor body is coupled by its second planar surface to a carrier substrate. The carrier substrate makes it possible to remove the growth substrate after the growth of the thin-film layer sequence and the coupling to the carrier substrate. The first planar surface of the semiconductor body is then formed by a side of the thin-film layer sequence or, if appropriate, by a side of the current spreading layer. This makes it possible for the radiation within the semiconductor body no longer to have to penetrate through the growth substrate in order to emerge from the semiconductor body. This can contribute to a particularly high radiation flow of the emitted radiation. Furthermore, this can contribute to heat that arises in the semiconductor body being dissipated particularly effectively since the carrier substrate can comprise a metal, for example.

In a further configuration, the surface emitting thin-film semiconductor laser comprises, at least at one first interface of the semiconductor body, at least one first optically active layer having a predetermined first reflectance. The first optically active layer is arranged in such a way that radiation coupled out from the active layer is mirrored toward the first optically active layer by means of the first mirror area. This makes it possible to increase or reduce a reflectance of the first interface. This enables the properties of the surface emitting thin-film semiconductor laser to be set particularly flexibly by means of the optically active layer. In this context, the optical efficacy of the optically active layer refers to the influence of the optically active layer on the reflection of the radiation at the first interface.

In a further configuration, a second optically active layer having a second predetermined reflectance is arranged at the first interface in such a way that radiation coupled out from the active layer is mirrored toward the second optically active layer by means of the second mirror area. This contributes to the fact that the properties of the surface emitting thin-film semiconductor laser can be set particularly flexibly. In particular, the second predetermined reflectance can be predetermined to be much higher than the first predetermined reflectance of the first optically active layer. This has the effect that the radiation coupled out from the active layer is almost completely reflected at the second optically active layer and coupled into the active layer again. This has the effect that a radiation flow of the radiation coupled out via the first mirror area is almost doubled, and the surface emitting thin-film semiconductor laser thus represents a 1-point light source having a particularly high intensity and/or radiation efficiency.

In a further configuration, the second optically active layer having the second predetermined reflectance is arranged at a second interface of the semiconductor body in such a way that radiation coupled out from the active layer is mirrored toward the second optically active layer by means of the second mirror area. The second optically active layer at the second interface has the same properties and/or advantages as the second optically active layer at the first interface. Furthermore, the first, the second and/or further optically active layers can be embodied in any desired combination at the first and/or the second interface.

In a further configuration, at least one of the interfaces is formed by one of the optically active layers and the first planar surface of the semiconductor body. This contributes to the effect that at the transition from the semiconductor body having the particularly high refractive index toward a vicinity of the semiconductor body having a particularly low refractive index, preferably as little radiation as possible is reflected back into the semiconductor body.

In a further configuration of the first aspect, the semiconductor body comprises at least one of the optically active layers. This can contribute to the optically active layers being produced in a particularly simple manner, in particular by epitaxial growth.

In a further configuration, the semiconductor body comprises at least one first lens which is embodied in such a way that a main radiation flow of the radiation coupled out from the active layer penetrates through the first lens. The lens makes it possible, in a simple manner, to focus or defocus the radiation upon emerging from the semiconductor body. One, two or more optically active layers can also be arranged on the lens. Furthermore, a plurality of lenses can be provided, for example a lens assigned to each mirror area and to the corresponding radiation coupled out.

In a further configuration, the surface emitting thin-film semiconductor laser comprises at least one monitor diode for detecting radiation from the active layer. This can contribute, in a simple manner, to operating the surface emitting thin-film semiconductor laser in regulated operation. Furthermore, this makes it possible, in a simple manner, to determine the radiation generated in the active layer.

In a further configuration, the semiconductor body comprises a radiation-generating region. A first and a second electrode are electrically coupled to one another via the radiation-generating region. Furthermore, the surface emitting thin-film semiconductor laser comprises a monitor region of the semiconductor body. The monitor region is separated from the radiation region at least by an interruption of the thin-film layer sequence. A first and a second monitor electrode are electrically coupled to one another via the monitor region. This makes it possible, in a simple manner, to detect the radiation and/or to regulate the surface emitting thin-film semiconductor laser.

In a further configuration, the semiconductor body comprises the radiation-generating region, via which the first and the second electrode are electrically coupled to one another. Furthermore, the semiconductor body comprises the monitor region comprising a third monitor electrode and a radiation-reactive layer at the third monitor electrode. The radiation-reactive layer is embodied in such a way that radiation that is coupled out from the active region by means of the second mirror area is mirrored toward the radiation-reactive layer. This makes it possible, in a simple manner, to detect the radiation generated in the active layer and/or to regulate the surface emitting thin-film semiconductor laser. The radiation-reactive layer is preferably applied to the growth substrate by epitaxial growth.

In accordance with at least one embodiment of the semiconductor laser, the latter has an inclined first mirror area and an inclined second mirror area, wherein the radiation generated in the at least one active layer is reflected to the first planar surface both via the first and via the second inclined mirror area. The radiation reflected from the mirror areas impinges perpendicularly on the first surface. Radiation reflected both from the first and from the second mirror area is coupled out at least partly at the first surface. The inclination of the mirror areas with respect to the first surface is, within the scope of the production tolerances, preferably 45°. A particularly intensive emission from the semiconductor laser is thereby made possible.

In accordance with at least one embodiment of the semiconductor laser, the latter comprises at least one monitor diode which is situated laterally alongside the at least one radiation-generating active layer. In other words, the monitor diode is offset with respect to the active layer, in a direction perpendicular to a connecting line between first and second inclined mirror areas. The monitor diode receives radiation that is emitted for instance by means of scattering laterally from the active layer. A powerful semiconductor laser of compact construction can be realized by means of such an arrangement of the monitor diode.

A second aspect provides a method for producing the semiconductor laser which is embodied as a surface emitting thin-film semiconductor laser. The semiconductor body is formed by epitaxial growth of the thin-film layer sequence on the growth substrate. The second planar surface of the semiconductor body is remote from the growth substrate. At least the first mirror area is formed from the second planar surface by removing semiconductor material from the thin-film layer sequence. This contributes to the effect that the surface emitting thin-film semiconductor laser can be formed in the wafer assemblage. Furthermore, preferably the surfaces and the mirror areas are processed, for example passivated, in the wafer assemblage.

In one configuration, the carrier substrate is applied to the second planar surface. The growth substrate is then separated from the thin-film layer sequence. This contributes to the effect that the radiation coupled out from the active layer preferably has to cover as little distance as possible within the semiconductor body and, consequently, preferably interacts as little as possible with the semiconductor body. This can contribute particularly effectively to the effect that the radiation emitted by the surface emitting thin-film semiconductor laser has a particularly high intensity. Furthermore, a surface emitting thin-film semiconductor laser can be made particularly narrow, for example narrower than 20 micrometers.

In a further configuration, the surface emitting thin-film semiconductor laser is produced in the wafer assemblage. The surface emitting thin-film semiconductor laser is detached from the wafer assemblage after the carrier substrate has been applied. This enables particularly precise and favorable production of the surface emitting thin-film semiconductor laser. Furthermore, this enables a metal to be used as material for the carrier substrate, in contrast to the growth substrate.

In a further configuration, before the carrier substrate is applied, at least the second electrode is applied to the second planar surface of the semiconductor body. This contributes to the effect that the second electrode is as near as possible to the thin-film layer sequence.

In a further configuration, before the growth of the thin-film layer sequence, the radiation-reactive layer is applied to the growth substrate by epitaxial growth. The current spreading layer is applied to the radiation-reactive layer. The thin-film layer sequence is formed by epitaxial growth on the current spreading layer. After the removal of the growth substrate, the radiation-reactive layer is removed outside the region provided for the third monitor electrode. Outside the radiation-reactive layer, the first electrode is formed on the functional layer. The third monitor electrode is formed on the radiation-reactive layer. This enables the detection of the radiation and/or the control of the surface emitting semiconductor laser in a particularly simple manner.

DETAILED DESCRIPTION OF THE DRAWINGS

Elements having the same construction or function are identified by the same reference symbols throughout the figures.

Figure 1:
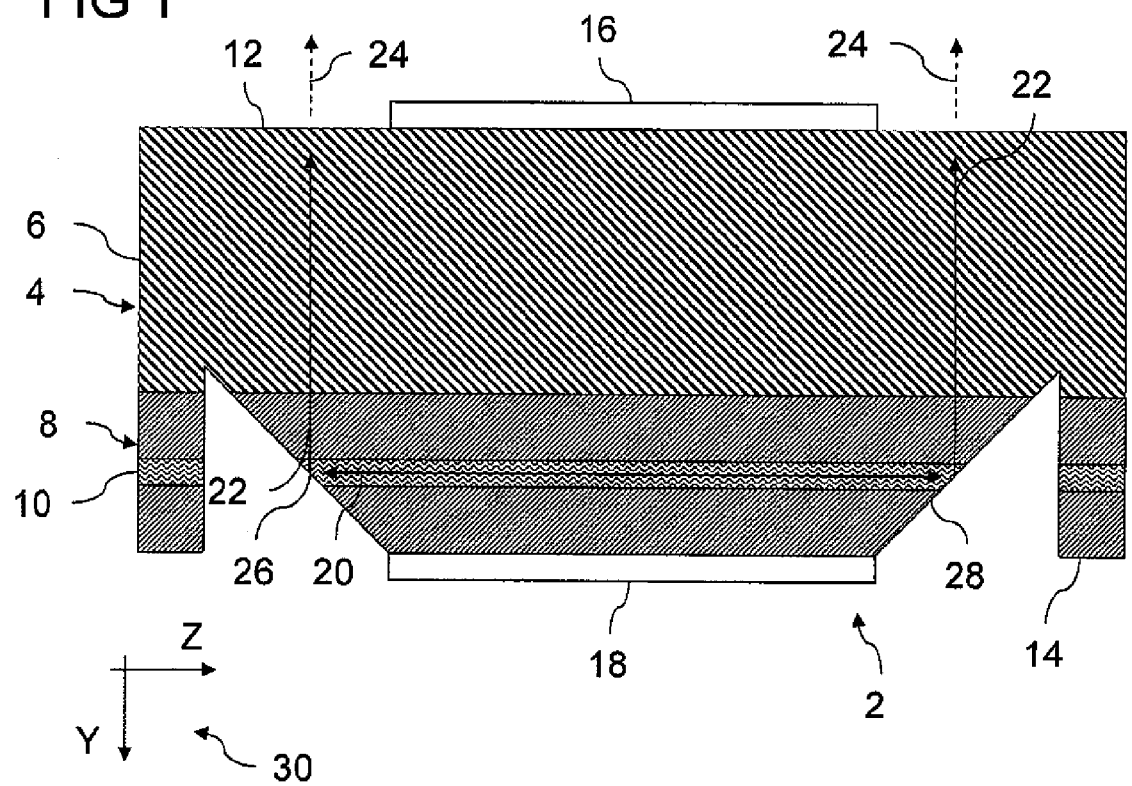
FIG. 1 shows a section through a first embodiment of a semiconductor laser.

A semiconductor laser is preferably embodied as a surface emitting thin-film semiconductor laser 2 (FIG. 1) and comprises a semiconductor body 4. The semiconductor body 4 can comprise a functional layer 6. As an alternative to this, the functional layer 6 can firstly be present during a production process for producing the surface emitting thin-film semiconductor laser 2 and then be at least partly removed. Furthermore, the semiconductor body 4 comprises a thin-film layer sequence 8 having at least one active layer 10.

The semiconductor body 4 forms a first planar surface 12 formed by a side of the semiconductor body 4 that is remote from a second planar surface 14. In order to generate radiation, the semiconductor body 4 is supplied with power preferably via a first electrode 16 and a second electrode 18. For this purpose, by way of example, a voltage is applied to the two electrodes. In addition to the active layer 10, the thin-film layer sequence 8 preferably comprises a cladding layer (not shown) formed between the active layer 10 and the functional layer 6, and a further cladding layer (not shown) formed between the active layer 10 and the second electrode 18. Preferably, a waveguide layer (not shown) is in each case formed between the two cladding layers and the active layer 10. The active layer 10 essentially comprises one, two or more quantum films, quantum dots and/or quantum strips. In other words, the quantization can be embodied in one-, two- or three-dimensional fashion.

The layers of the semiconductor body 4 are preferably doped. By way of example, one of the two cladding layers is n-doped, and the other is p-doped. Depending on which of the two cladding layers is p-doped and which is n-doped, the polarity of the two electrodes is chosen such that, on account of the applied voltage, positive charge carriers migrate from the p-doped region and negative charge carriers migrate from the n-doped region toward the active layer 10 and recombine there. Furthermore, the functional layer 6 can be at least partly doped. The doping of all the doped layers of the semiconductor body 4 on the same side of the active layer 10 is qualitatively preferably identical, that is to say either p-doped or n-doped, and the doping of the layers on the other side of the active layer 10 is oppositely doped. As a result of the recombination of the charge carriers in the active layer 10, radiation 20 is generated in the active layer 10. The cladding layers prevent an opposite migration of the free charge carriers and thus increase the recombination rate in the active layer 10. Furthermore, the waveguide layers preferably have a higher refractive index than the cladding layers. This brings about a lateral guidance of the radiation 20 in the active layer 10 perpendicular to an area normal of the layers of the thin-film layer sequence 8.

The radiation 20 within the active layer 10 is coupled out from the active layer 10 by mirroring at least at a first mirror area 26 and preferably at a second mirror area 28. A radiation 22 coupled out from the active layer is preferably reflected in a direction perpendicular to the first planar surface 12. In order that the surface emitting thin-film semiconductor laser 2 can be operated with an intensity that is preferably as high as possible, preferably the first planar surface 12 is passivated in an exit region of the radiation 24, that is to say that for example oxygen atoms are removed from the surface, for example by means of hydrogen cleaning. The mirror areas 26, 28 can also be referred to as totally reflecting mesa flanks. The mirror areas 26, 28 are embodied in a manner inclined with respect to the active layer 10 and preferably form an angle of 45 degrees with the active layer 10. However, the angle can also vary between 35 and 55 degrees, for example. Preferably, a distance between the mirror areas 26, 28 is chosen in such a way that radiation 20 reflected back into the active layer 10 amplifies the generation of radiation. The first and/or the second mirror area 26, 28 can be formed merely by the interface between semiconductor body 4 and surroundings of the semiconductor body 4. However, it is also possible to apply a dielectric layer to the mirror areas 26, 28 and/or, if appropriate, a metal layer to the dielectric layer. The mirror areas 26, 28 are preferably passivated.

The two electrodes can be constructed in layered fashion. By way of example, the electrode to which a positive potential is applied can comprise a chromium or titanium layer, which functions as an adhesion promoter and electrical contact with respect to the semiconductor body. The chromium layer can then be followed by a platinum layer, which acts as a diffusion barrier. The platinum layer can then be coated with a gold layer, which makes it possible simply to effect contact-connection of the electrode to the current and/or voltage supply for example by bonding. The second electrode 18 can thus be coupled to a carrier substrate, for example.

The electrode connected to the negative potential preferably comprises gold, nickel, titanium and/or germanium.

The n-doped cladding layer comprises for example aluminum gallium arsenide having an aluminum proportion of 40%. The p-doped cladding layer can likewise comprise aluminum gallium arsenide having an aluminum content of 40%. The two waveguide layers can comprise aluminum gallium arsenide having an aluminum proportion of 20%. The active layer 10, in particular the quantum film thereof, comprises for example indium gallium arsenide having an indium proportion of 10%. As an alternative to this, in order to generate a red laser radiation, the active layer 10 can comprise indium gallium aluminum phosphide. In order to generate a radiation in the infrared range, the active layer 10 can also comprise indium aluminum gallium arsenide. Furthermore, other material combinations can also be used in order to generate other colors.

The functional layer 6 has a thickness of 100 micrometers, for example. The cladding layers and the waveguide layers can have a thickness of 1 micrometer, for example. The active layer 10, in particular the quantum film thereof, has a thickness of 10 nanometers, for example. Since the thin-film layer sequence 8 is preferably made so thin, the additional expression "thin-film" is attached to the designation "surface emitting semiconductor laser".

A system of coordinates 30 identifies an orientation of the surface emitting thin-film semiconductor laser 2.

Figure 2:
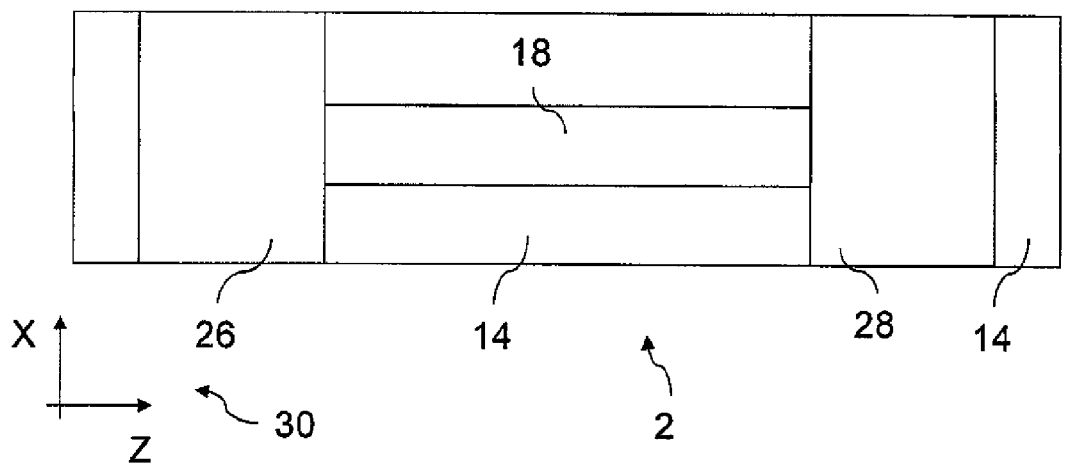
FIG. 2 shows a further view of the first embodiment of the semiconductor laser.

A further view of the surface emitting thin-film semiconductor laser 2 (FIG. 2) reveals that the second electrode 18 does not have to cover the entire width of the second planar surface 14. Furthermore, the thin-film layer 8 can have the full thickness for example only in the region of overlap with the second electrode 18 and be made narrower outside the region of overlap. As a result of the tapering of thin-film layer 8, the mirror areas 26, 28 can be inclined with respect to the active layer 10, and for example, form an angle of 45 degrees with said active layer 10. Radiation is then coupled out from the active layer 10 by reflection at the mirror areas 26, 28.

Figure 3:
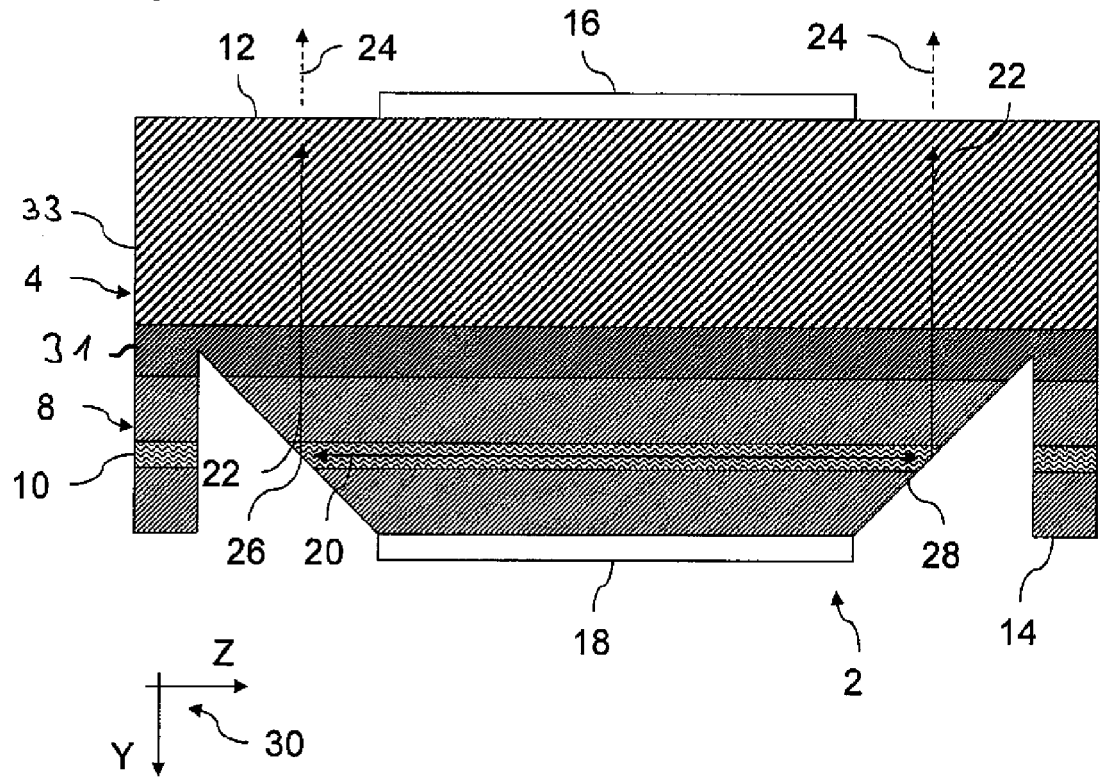
FIG. 3 shows a section through a second embodiment of the semiconductor laser.

The functional layer 6 can comprise for example a current spreading layer 31 and/or a growth substrate 33 (FIG. 3). The current spreading layer 31 can be grown for example epitaxially on the growth substrate 33. The current spreading layer 31 has a very high electrical conductivity parallel to the active layer 10. This has the effect that charge carriers that move toward the thin-film layer sequence 8 on account of the applied voltage are distributed over the entire area of the active layer 10, particularly if the first and/or the second electrode 16, 18 cover(s) only a small part of the first and/or second planar surface 12, 14, respectively. This has the effect that the recombination of the charge carriers takes place in the entire active layer 10. This leads to particularly effective generation of radiation in the active region 10. As an alternative or in addition, the growth substrate 33 can also be embodied in such a way that it performs the function of the current spreading layer 31.

Figure 4:
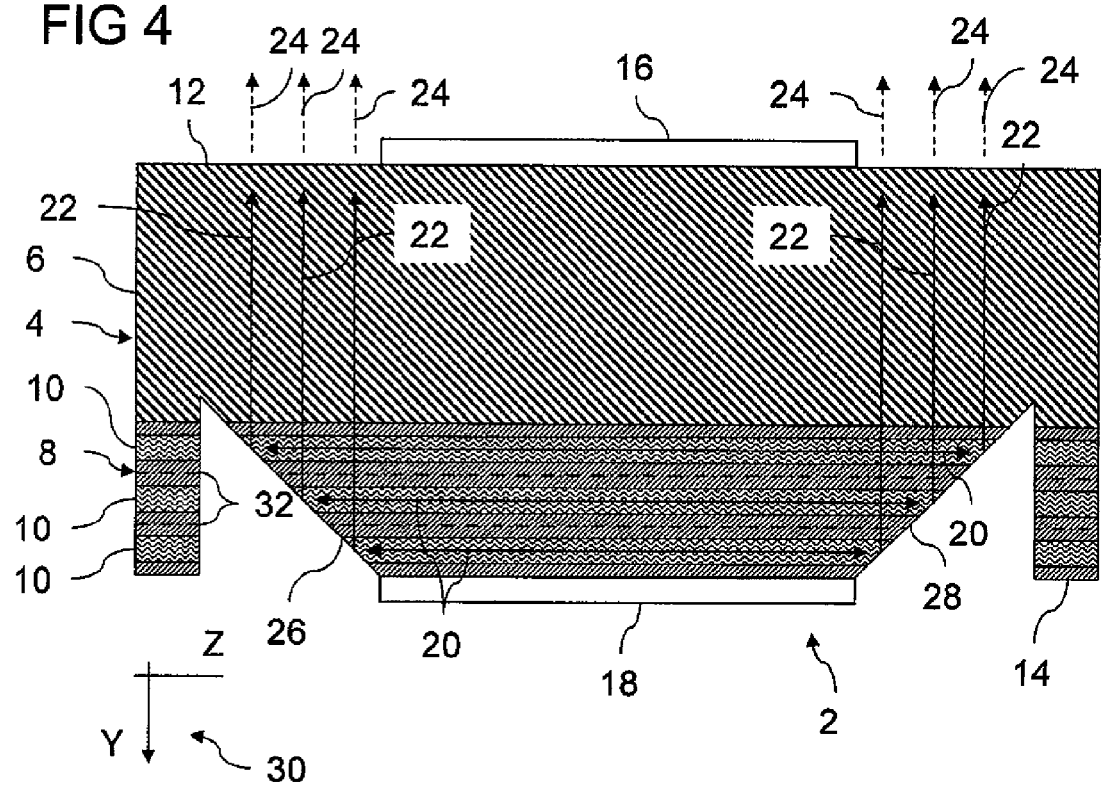
FIG. 4 shows a section through a third embodiment of the semiconductor laser.

An intensity of the surface emitting thin-film semiconductor laser 2 can be increased further by providing two or more active regions 10 (FIG. 4). The plurality of active regions 10, in accordance with the embodiment with an individual active region 10, are preferably embedded into a plurality of waveguide and cladding layers and thereby separated from one another. In order that a charge carrier transfer nevertheless takes place via the pn or np junctions—for example of the cladding layers—that are as a result inevitably at least partly oriented in the reverse direction with respect to one another, tunnel junctions 32 are formed between the corresponding pn or np junctions oriented in the reverse direction with respect to one another. The tunnel junctions enable the charge carriers to tunnel via the reverse-biased junctions. Generation of radiation in the surface emitting thin-film semiconductor laser 2 can be improved particularly effectively as a result. The tunnel junctions 32 can be realized by highly doped layers, for example. Tunnel junctions of this type are known from U.S. Pat. No. 5,212,706 for an edge emitting semiconductor laser, for example. The content of U.S. Pat. No. 5,212,706 is hereby incorporated by reference.

Figure 5:
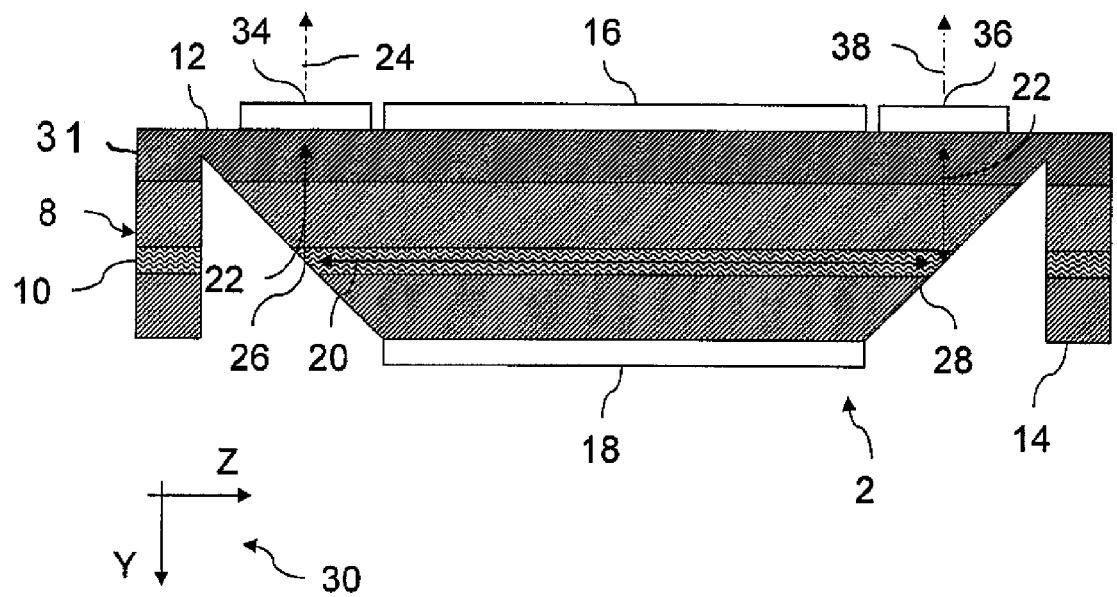
FIG. 5 shows a section through a fourth embodiment of the semiconductor laser.

As an alternative to this, all the embodiments of the surface emitting thin-film semiconductor laser 2 can also be formed without the functional layer 6, in particular without the growth substrate 33 and/or the current spreading layer 31 (FIG. 5). This has the effect that the radiation coupled out from the active layer 10 preferably covers as little distance as possible within the semiconductor body 4 and, consequently, preferably interacts as little as possible with the semiconductor body 4. This can contribute to increasing the intensity of the surface emitting thin-film semiconductor laser 2 and to making the surface emitting thin-film semiconductor laser 2 narrower than 20 micrometers.

Figure 8:
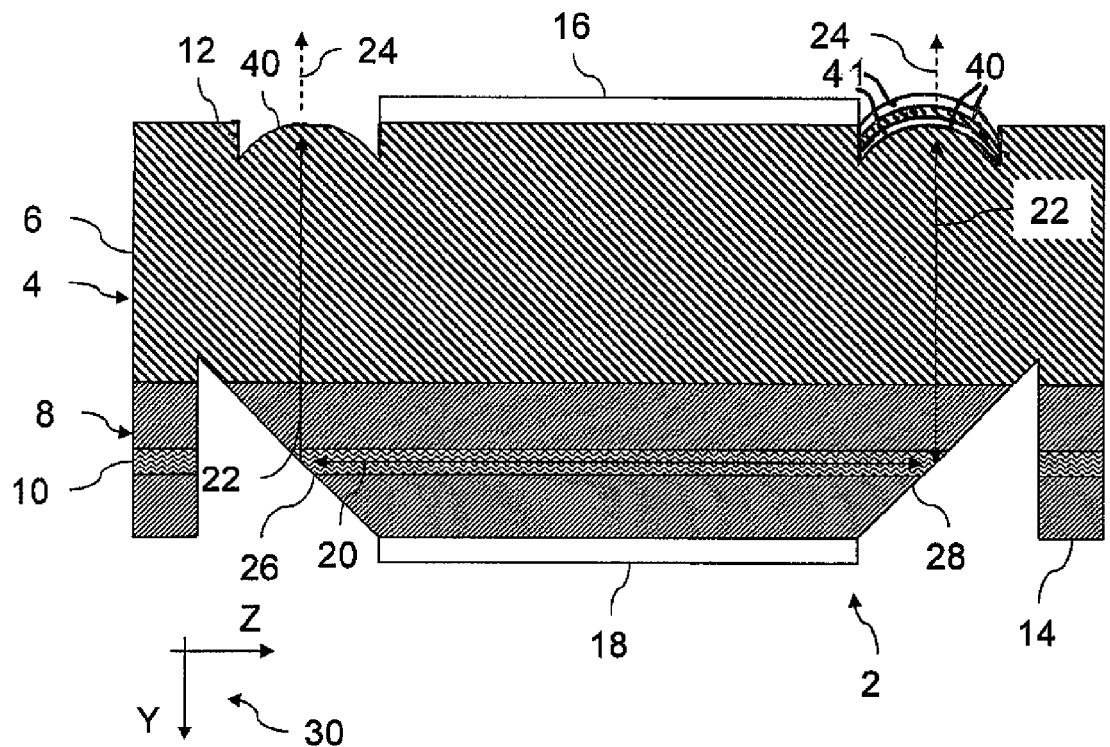
FIG. 8 shows a section through a seventh embodiment of the semiconductor laser.

Furthermore, in order to influence the radiation 24 emitted by the surface emitting thin-film semiconductor laser 2, one, two or more optically active layers can be formed at one, two or more interfaces of the semiconductor body 4. In this context, the optically active layers serve to increase or reduce reflection at the corresponding interface. For this purpose, the optically active layers have predetermined refractive indexes which can have different values for different optically active layers. The optically active layers comprise for example a first and/or second optically active surface layer 34, 36, a Bragg mirror 42 (FIG. 9) and/or an optically active lens layer 41 (FIG. 8). The optically active layers can influence a radiation efficiency per energy expended. Furthermore, it is possible to lower an energy threshold, in other words laser threshold, starting from which laser radiation is generated. Furthermore, by means of the optically active layers it is possible to set a radiation power of the surface emitting thin-film semiconductor laser 2 for a predetermined supply energy. Furthermore, the optically active layers can be used to predetermine particularly precisely a wavelength of the radiation emerging from the surface emitting thin-film semiconductor laser 2.

The first optically active surface layer 34 can reduce for example a reflection of the radiation 22 coupled out from the active region at the first planar surface 12.

As an alternative or in addition, for example the second optically active surface layer 36 can increase a reflection at the first planar surface 12 of the semiconductor body 4. In this case, the reflection can be increased by the second optically active surface layer 36 for example to an extent such that virtually complete reflection occurs at the interface between the first planar surface 12 and the second optically active layer 36. This has the effect that the radiation 22 coupled out from the active layer 10 is reflected back into the active layer 10. This has the effect that the radiation 24 emerges from the semiconductor body only in a small exit region. An attenuated radiation 38 that has emerged through the second optically active layer can then be disregarded. Furthermore, it is thereby possible to lower the laser threshold at which laser beam generation occurs. As an alternative to this, it is also possible for just one of the two optically active surface layers to be provided.

Figure 6:
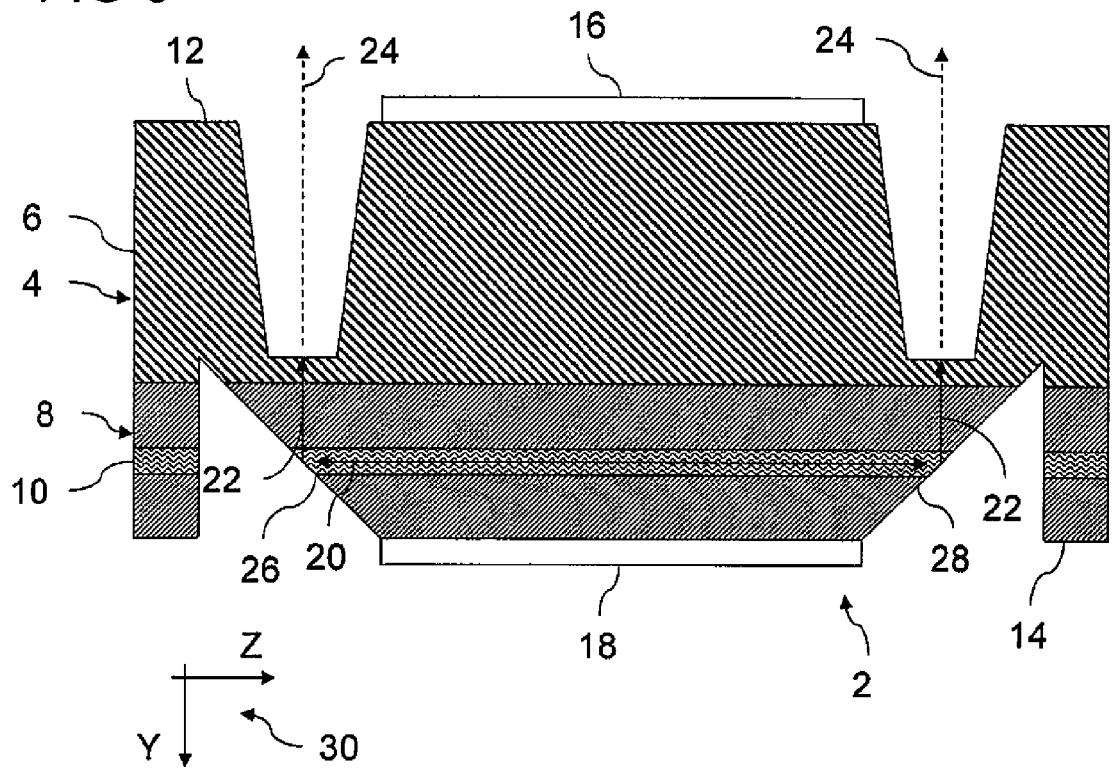
FIG. 6 shows a section through a fifth embodiment of the semiconductor laser.

A small degree of interaction of the radiation 22 coupled out from the active layer 10 in the semiconductor body 4 can also be achieved for example by virtue of the functional layer 6 being narrower in a region in which a main radiation flow occurs during the operation of the semiconductor laser 4 than outside the region (FIG. 6).

Figure 7:
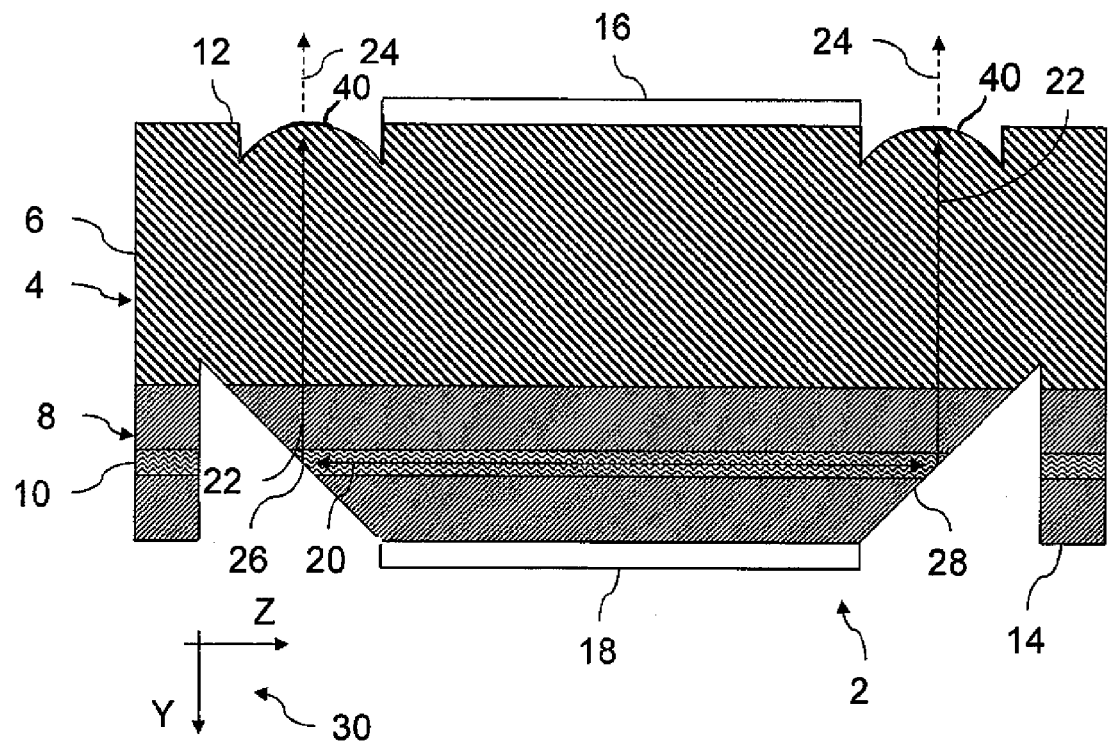
FIG. 7 shows a section through a sixth embodiment of the semiconductor laser.

The radiation can be focused and/or defocused by one or two lenses 40 upon emerging from the semiconductor body 4 (FIG. 7). In connection with the lens or lenses 40 it may be advantageous for the lenses 40 to be far away from the mirror areas 26, 28. This can be achieved by means of a relatively thick growth substrate 33.

The lenses 40, the mirror layers 26, 28 and/or the narrowing of the functional layer 6 are preferably formed by etching methods.

The embodiments can also be combined for example in such a way that the one or more optically active lens layers 41 are applied to one or more lenses 40 (FIG. 8). The optically active lens layer 41 can also be referred to as a dielectric mirror.

Figure 9:
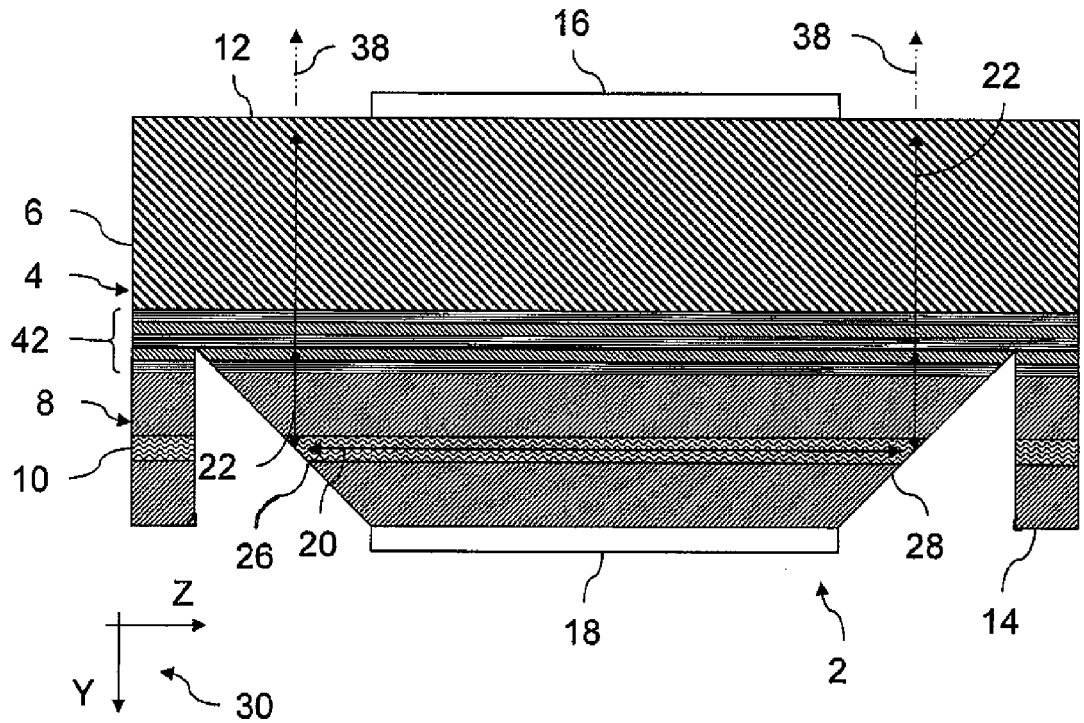
FIG. 9 shows a section through an eighth embodiment of the semiconductor laser.

The Bragg mirror 42 can be monolithically integrated in the semiconductor 4 for example by epitaxial growth (FIG. 9). In this case, it may be advantageous for the Bragg mirror 42 to be formed preferably as near as possible to the mirror areas 26, 28 and/or the active layer 10 since a particularly high proportion of the radiation coupled out from the active layer 10 is then reflected back into the active layer 10. The Bragg mirror 42 is distinguished by the fact that its reflectivity depends on the angle of incidence of the radiation with respect to a normal to the surface of the Bragg mirror 42 and on a wavelength of the radiation. The semiconductor material of the Bragg mirror 42 is preferably doped, to be precise in accordance with the other doped layers, for example the cladding layer, on the same side of the active layer 10. In order that the Bragg mirror 42 acts in a highly reflective manner, e.g. with a reflectivity of more than 95% for perpendicular radiation incidence, the Bragg mirror 42 is preferably formed from a multiplicity of layers arranged one above another. The reflectivity of the Bragg mirror 42 can be set by way of the number of layers. The number of layers required for a predetermined reflectivity rises highly nonlinearly with increasing predetermined reflectivity. If the Bragg mirror 42 and one of the other optically active layers are formed one behind another in a radiation direction, then the Bragg mirror 42 can be formed with a smaller number of layers. As a result it is possible to reduce epitaxy times and hence production costs.

Figure 10:
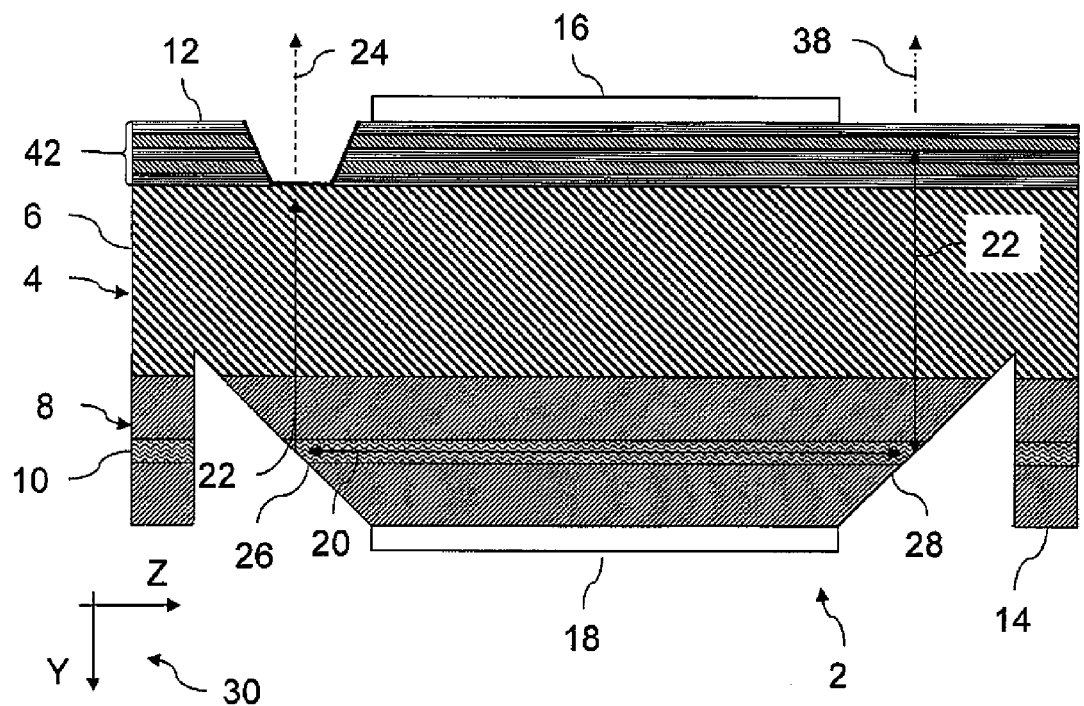
FIG. 10 shows a section through a ninth embodiment of the surface emitting thin-film semiconductor laser.

As an alternative to this, the Bragg mirror 42 can be grown onto the functional layer 6 or the growth substrate 33. In this case, the Bragg mirror 42 can comprise, both within the semiconductor body 4 and grown on the functional layer 6, a region in which the Bragg mirror 42 is narrower or not present at all (FIG. 10). This in turn causes the radiation only to be influenced by means of the Bragg mirror 42 on a side of the emerging radiation 38 and can therefore contribute, in the sense of the optically active layer, to lowering the energy threshold.

Figure 11:
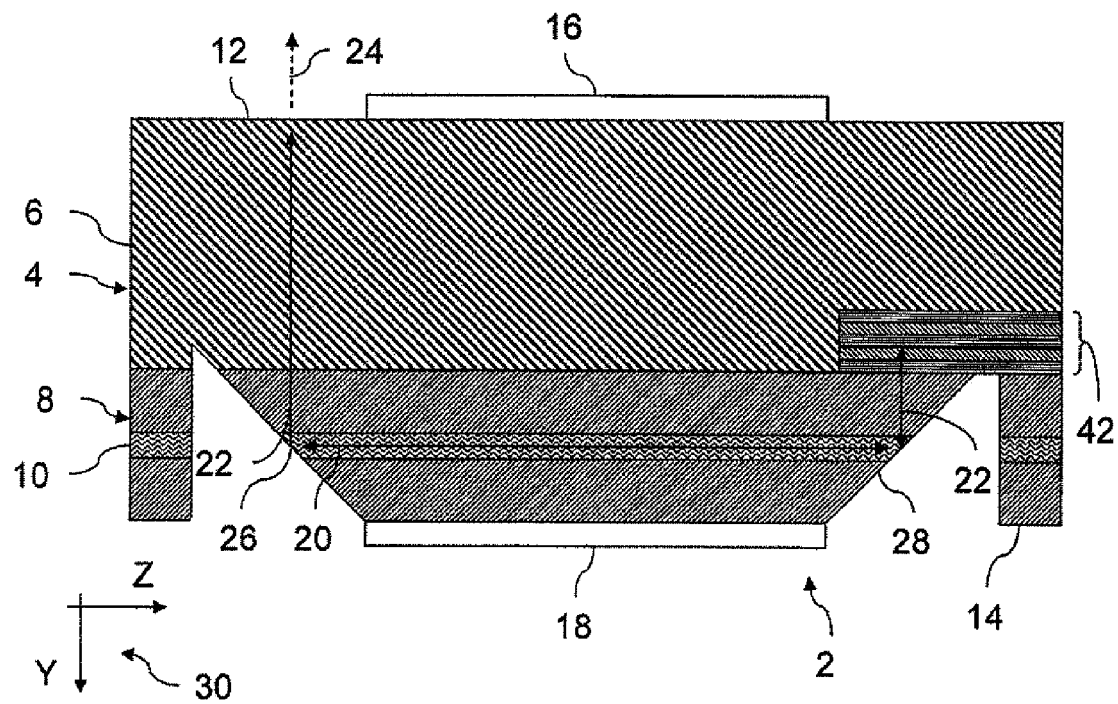
FIG. 11 shows a section through a tenth embodiment of the semiconductor laser.

The Bragg mirror 42 can also be formed within the semiconductor body 4 only in a region of the main radiation flow that occurs (FIG. 11). This can be achieved during the production process for example by lateral moist-thermal oxidation of the Bragg mirror for example via a hole in the wafer. As an alternative to this, a false and/or detuned Bragg mirror can be grown, which is then converted into the Bragg mirror 42 by moist-thermal oxidation in a predetermined region. The moist-thermal oxidation is known from U.S. Pat. No. 5,696,023 for example, the content of which is hereby incorporated by reference.

Figure 12:
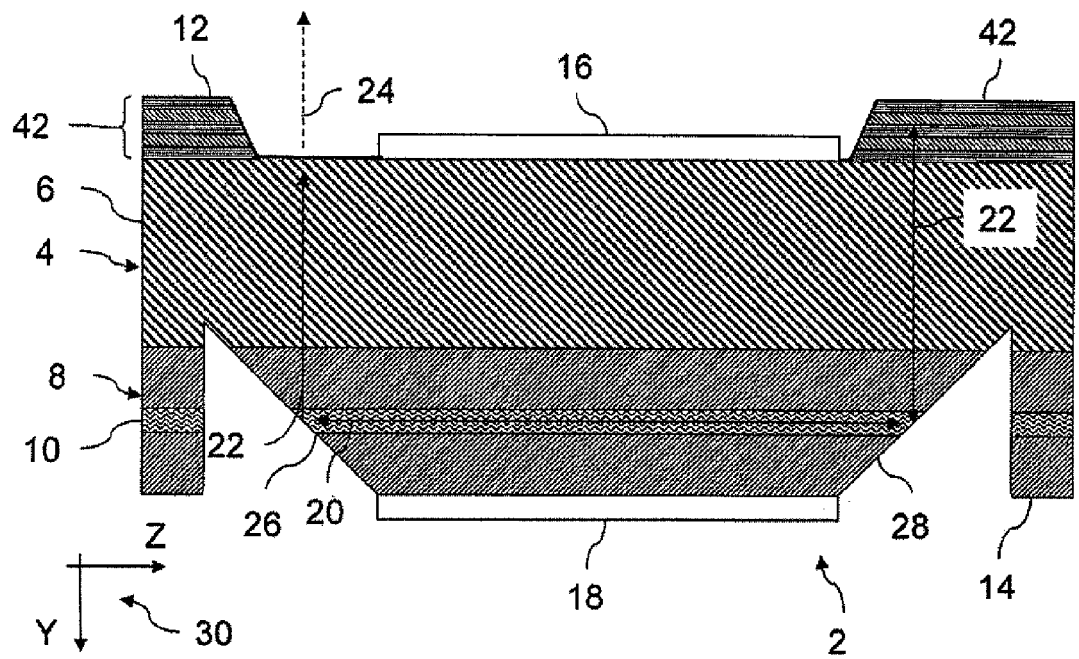
FIG. 12 shows a section through an eleventh embodiment of the semiconductor laser.

If the Bragg mirror 42 is grown on the functional layer 6 in such a way that it forms the first planar surface 12 of the semiconductor body 4 (FIG. 12), then the Bragg mirror 42 can also have no region of overlap with the first electrode 16. This has the effect that the charge carrier transport does not take place through the Bragg mirror 42. As a result, the charge carrier transport is subjected to fewer interactions. This can contribute to the effect that the applied voltage can be chosen to be low for a predetermined radiation power.

Figure 13:
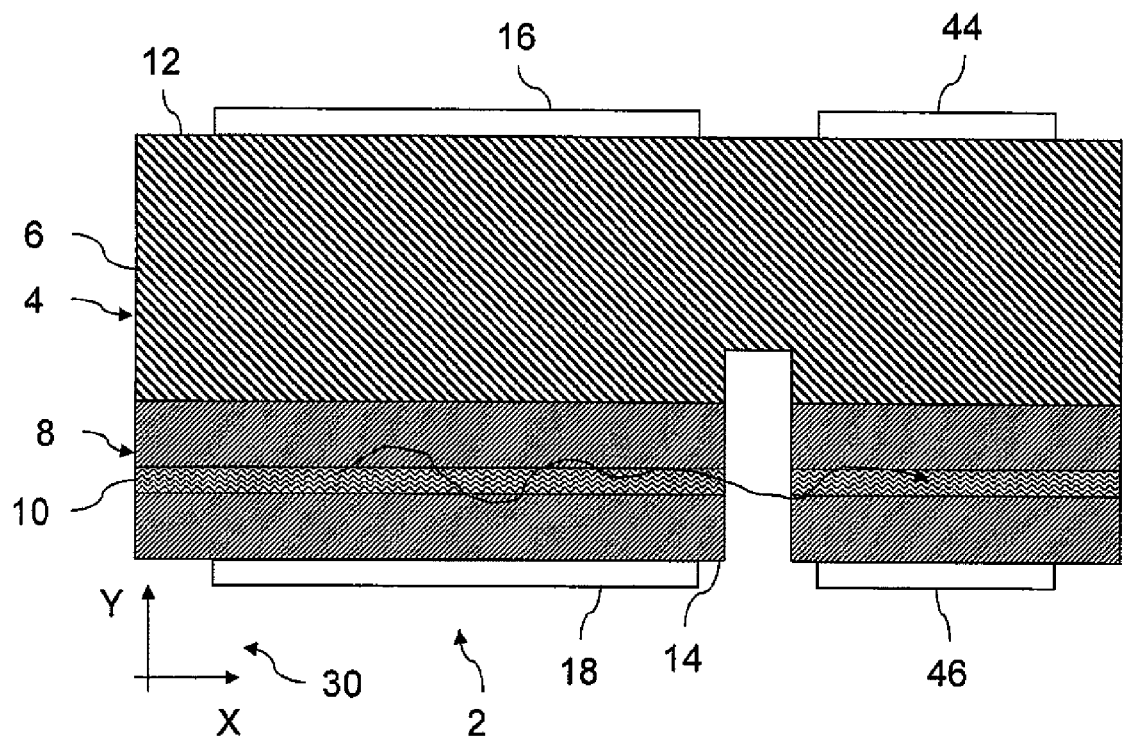
FIG. 13 shows a section through a first embodiment of the semiconductor laser with monitor electrode.

In order to detect the radiation generated, a monitor region of the surface emitting thin-film semiconductor laser 2 can be provided in a direction perpendicular to a connecting line between the two mirror areas 26, 28 (FIG. 13). The monitor region is separated from a radiation-generating region of the surface emitting thin-film semiconductor laser 2 at least by an interruption of the active layer 10. The monitor region is formed between a first and a second monitor electrode 44, 46. The radiation-generating region is formed between the first and the second electrode 16, 18. Furthermore, at the first monitor electrode 44 and at the second monitor electrode 46, only a voltage and/or a current is measured or a current and/or a voltage having opposite polarity to the two electrodes in the radiation-generating region is applied and the voltage actually present and/or the current actually present is detected. Depending on the detected voltage and/or the detected current, it is then possible to determine the radiation generation in the active layer 10 of the radiation-generating region of the surface emitting thin-film semiconductor laser 2. The radiation generation can thereby be detected and/or controlled. Consequently, the active layer 10 in the monitor region serves as a sensor for the radiation from the active layer 10.

Figure 14:
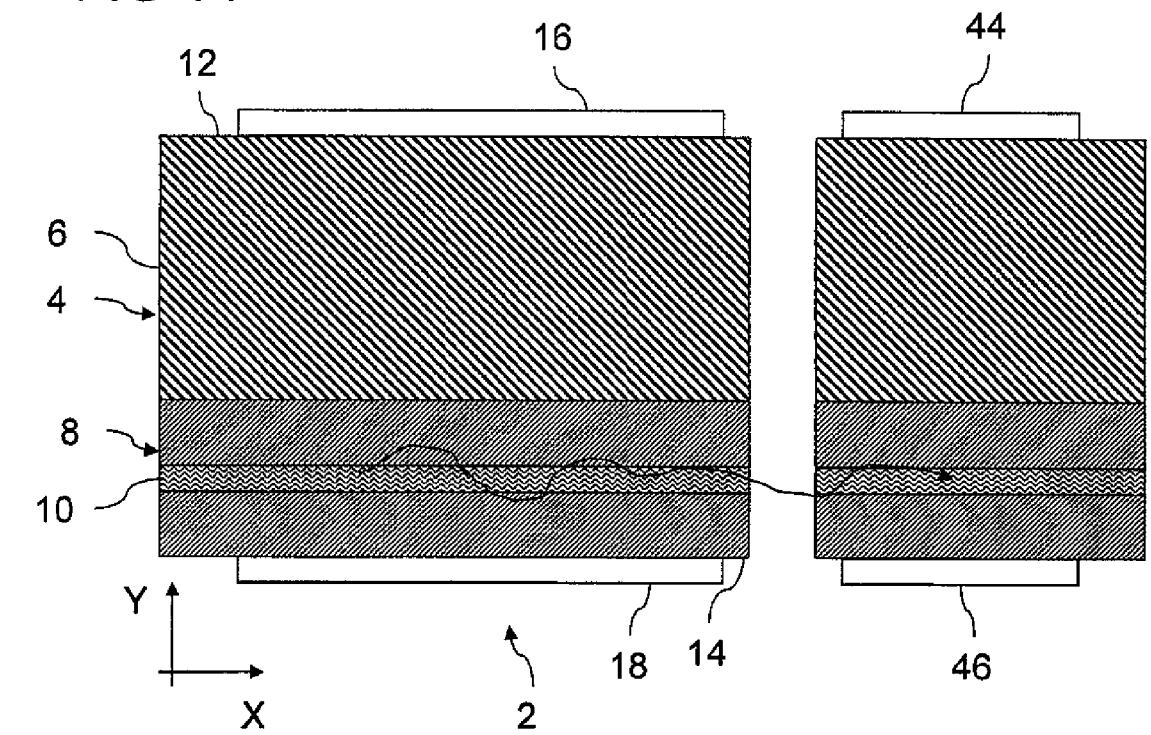
FIG. 14 shows a section through a second embodiment of the semiconductor laser with monitor electrode.

As an alternative to this, the monitor region can be completely separated from the radiation-generating region (FIG. 14). In this context, however, preferably the second planar surface 14 of the radiation-generating region and of the monitor region are coupled to one another via the common carrier substrate.

Figure 15:
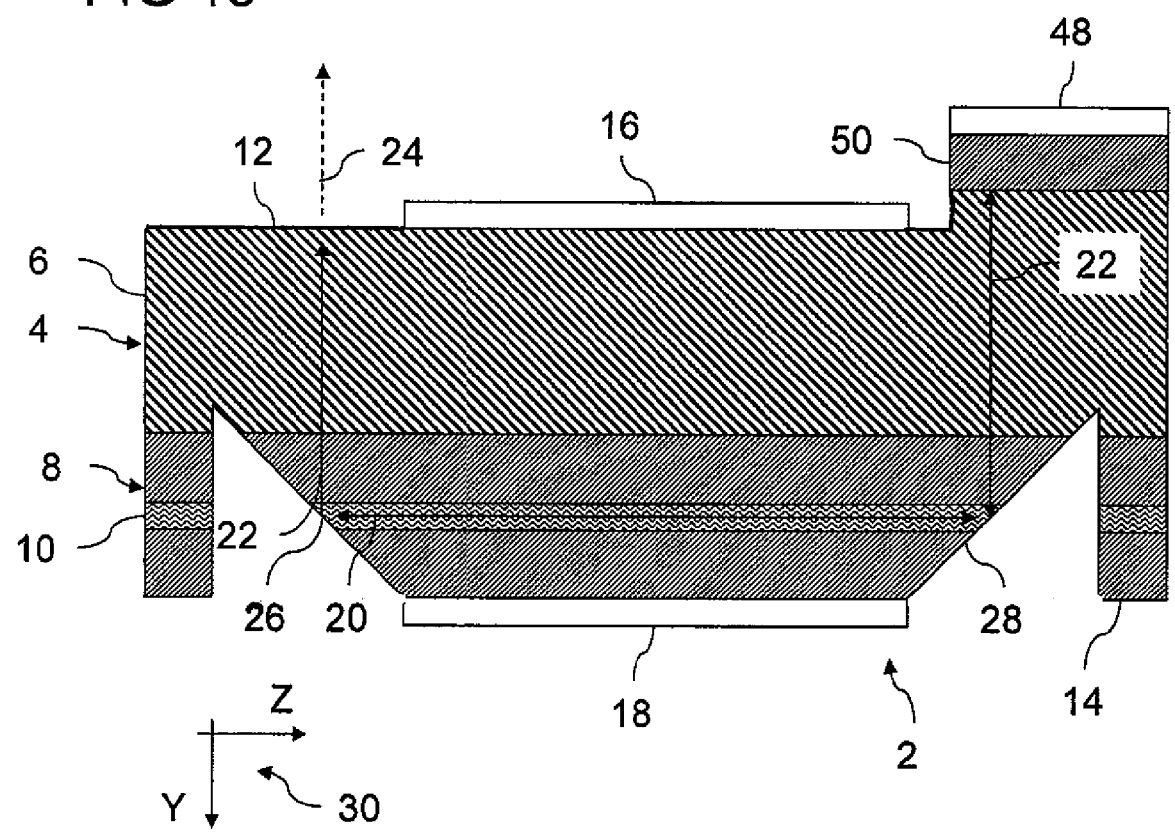
FIG. 15 shows a section through a third embodiment of the semiconductor laser with monitor electrode.

The monitor region can also be formed by a radiation-reactive layer 50 being coupled to the first planar surface 12 of the semiconductor body 4, wherein a third monitor electrode 48 is then provided on the radiation-reactive layer 50 (FIG. 15). The radiation 22 coupled out from the active layer 10 via the second mirror area 28 is then preferably deflected to the radiation-reactive region 50 and induces a voltage between the second electrode 18 and the third monitor electrode 48. This voltage can be used to determine and/or control the radiation generation within the active layer 10. In addition, a Bragg mirror 42 can be formed between the radiation-reactive layer 50 and the thin-film layer sequence 8, through which Bragg mirror only radiation having predetermined wavelength then passes and is detected by the radiation-reactive layer 50 and the third monitor electrode 48 and/or through which Bragg mirror the radiation is at least partly reflected back into the active layer 10.

Figure 16:
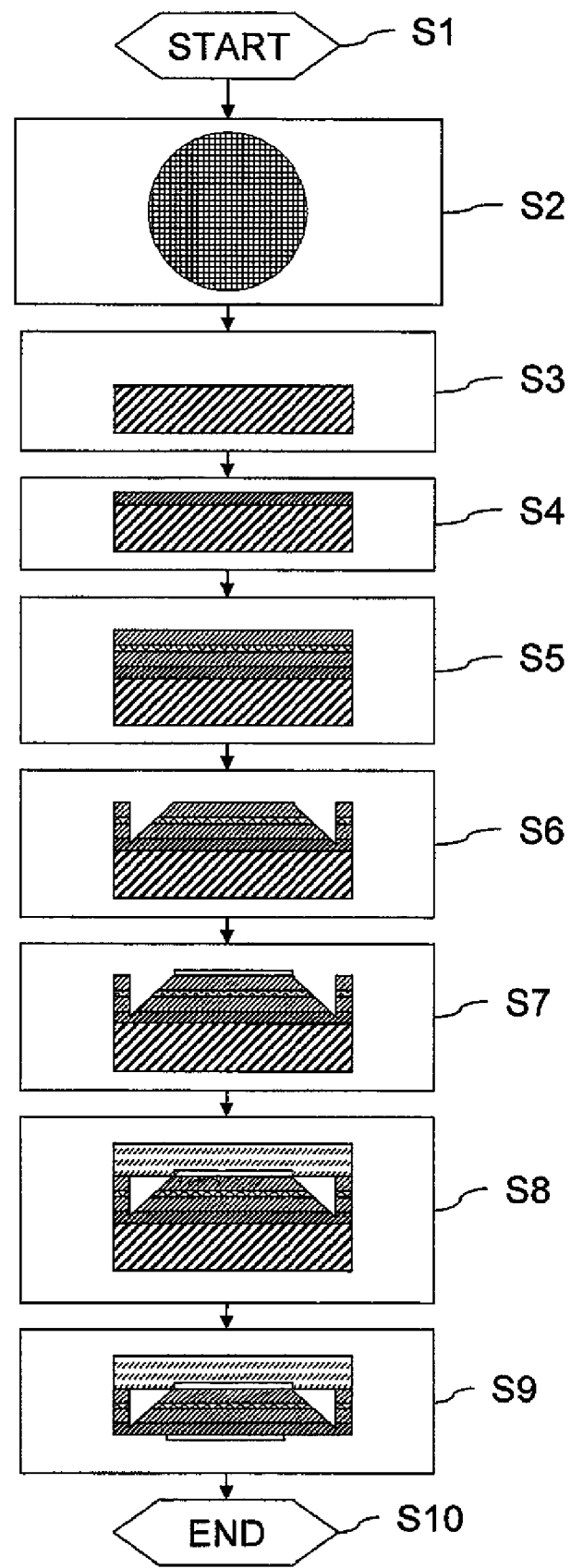
FIG. 16 shows a flowchart of a method for producing the semiconductor laser.

A method for producing the surface emitting thin-film semiconductor laser 4 is preferably started in a step S1 (FIG. 16), which involves producing a material for the wafer, for example. The material for the wafer can comprise gallium arsenide, for example and/or be doped with silicon.

In a step S2, the wafer, which represents the growth substrate 33, for example, is cut out and prepared for the further treatment. The growth substrate 33 can have a thickness of 600 micrometers, for example.

In a step S3, the wafer, illustrated by way of example at one of the surface emitting thin-film semiconductor lasers 4 of the wafer, in the wafer assemblage is placed into a device for epitaxial layer growth.

In a step S4, the current spreading layer 31 can be grown epitaxially onto the growth substrate 33. An etching stop layer can be formed on the growth substrate 33 beforehand.

In a step S5, the thin-film layer sequence 8 with the active layer 10 is grown epitaxially onto the current spreading layer 31.

In a step S6, the mirror areas 26, 28 are formed by means of photoresist and etching methods. Furthermore, in the step S6, the planar surfaces in the exit region of the radiation and/or the mirror areas 26, 28 can be passivated.

In a step S7, the second electrode 18 can be applied to the thin-film layer sequence 8.

In a step S8, a carrier substrate is coupled to the second planar surface 14 of the semiconductor body 4. The carrier substrate can comprise metal and/or germanium, for example. By way of example, the entire wafer with the thin-film layer sequence 8 is soldered onto the carrier substrate.

In a step S9, preferably the growth substrate 33 is at least partly removed, for example by means of a chemical etching method, and the first electrode 16 is coupled to the semiconductor body 4. Without the growth substrate 33, the surface emitting thin-film semiconductor laser 2 can be narrower than 20 micrometers.

In a step S10, the method for producing a surface emitting thin-film semiconductor laser 2 can be ended by detaching the semiconductor laser 4 from the wafer assemblage.

As an alternative or in addition, even further steps can be processed during the method for producing the surface emitting thin-film semiconductor laser 2. By way of example, the radiation-reactive layer 50 can be applied to the growth substrate 33 by epitaxial growth. The current spreading layer 31 can thereupon be applied to the growth substrate 33 and the radiation-reactive layer 50. The thin-film layer sequence 8 is then formed by epitaxial growth on the current spreading layer 31. After the removal of the growth substrate 33, the radiation-reactive layer 50 can then be removed outside the region provided for the third monitor electrode 48. Outside the radiation-reactive layer 50, the first electrode 16 is then formed and the third monitor electrode 48 is then formed on the radiation-reactive layer 50.

The surface emitting thin-film semiconductor laser 2 can have a reflective layer at a first main area—facing toward the carrier substrate—of the radiation-generating thin-film layer sequence 8, said reflective layer reflecting at least part of the electromagnetic radiation generated in the thin-film layer sequence 8 back into the latter.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A semiconductor laser which is embodied as a surface emitting thin-film semiconductor laser with a semiconductor body, comprising:
    a first and a second planar surface;
    an epitaxially grown thin-film layer sequence with at least one active layer between the first and second planar surfaces, the active layer comprising a radiation-generating region;
    at least one passivated first mirror area inclined with respect to the at least one active layer for coupling out radiation from the at least one active layer toward the first planar surface; and
    a first electrode applied on the first planar surface and a second electrode applied on the second planar surface, said first and second electrodes being in direct contact with the thin-film layer sequence;
    wherein the first and the second electrodes comprise at least one metal or at least one metal alloy; and
    wherein the semiconductor laser is free of a growth substrate in the thin-film layer sequence.

2. The semiconductor laser as claimed in claim 1, wherein the semiconductor body includes, for coupling out radiation from the at least one active layer toward the first planar surface, a second mirror area inclined with respect to the at least one active layer.

3. The semiconductor laser as claimed in claim 1, wherein the thin-film layer sequence comprises a plurality of active layers in which the radiation is generated and which are electrically coupled to one another by tunnel junctions monolithically integrated in the thin-film layer sequence.

4. The semiconductor laser as claimed in claim 1, wherein the semiconductor body comprises a functional layer, whose side remote from the thin-film layer sequence forms the first planar surface of the semiconductor body, and wherein the functional layer is narrower in a region in which a main radiation flow of the radiation coupled out from the at least one active layer occurs during operation of the surface emitting thin-film semiconductor laser than outside the region.

5. The semiconductor laser as claimed in claim 4, wherein the functional layer comprises one of a current spreading layer and a growth substrate.

6. The semiconductor laser as claimed in claim 1, wherein the semiconductor body is coupled by its second planar surface to a carrier substrate.

7. The semiconductor laser as claimed in claim 1, further comprising:
    at least at one first and/or one second interface of the semiconductor body, at least one first and/or second optically active layer having a predetermined first reflectance which is arranged such that the radiation coupled out from the at least one active layer is mirrored toward the first and/or second optically active layer by at least one of the first and/or second mirror area.

8. The semiconductor laser as claimed in claim 7, wherein at least one of the first and second interfaces is formed by one of the first and second optically active layers and the first planar surface, or wherein the semiconductor body comprises at least one of the optically active layers.

9. The semiconductor laser as claimed in claim 1, wherein the semiconductor body comprises at least one first lens embodied such that a main radiation flow of the radiation coupled out from the at least one active layer penetrates through the first lens.

10. A semiconductor laser embodied as a surface emitting thin-film semiconductor laser with a semiconductor body, comprising:
    a first and a second planar surface;
    an epitaxially grown thin-film layer sequence with at least one active layer between the first and second planar surfaces, the active layer comprising a radiation-generating region;
    at least one passivated first mirror area inclined with respect to the at least one active layer for coupling out radiation from the at least one active layer toward the first planar surface;
    a first electrode applied on the first planar surface and a second electrode applied on the second planar surface, said first and second electrodes being in direct contact with the thin-film layer sequence; and
    a further radiation-generating region of the semiconductor body, by which a first and a second electrode are electrically coupled to one another, and which comprises a monitor region of the semiconductor body for detecting the radiation from the at least one active layer, which is separated from the radiation-generating region at least by an interruption of the thin-film layer sequence and by which a first and a second monitor electrode are electrically coupled to one another;
    wherein the first and the second electrodes comprise at least one metal or at least one metal alloy;
    wherein the semiconductor laser is free of a growth substrate in the thin-film layer sequence;
    wherein the semiconductor body includes, for coupling out radiation from the at least one active layer toward the first planar surface, a second mirror area inclined with respect to the at least one active layer; and wherein the monitor region is offset with respect to a connecting line between the first and second inclined mirror areas, laterally with respect to the at least one active layer, or whose semiconductor body alternatively comprises the further radiation-generating region, by which the first and the second electrodes are electrically coupled to one another, and whose semiconductor body comprises the monitor region comprising a third monitor electrode and a radiation reactive layer at the third monitor electrode, which is embodied such that the radiation coupled out from the active region by the second mirror area is mirrored toward the radiation reactive layer, and the radiation coming to and from the monitor region travels in a direction perpendicular to the first and second planar surfaces.

11. A method for producing the semiconductor laser as claimed in claim 1, which is embodied as a surface emitting thin film semiconductor laser, comprising the steps of:
    forming the semiconductor body by epitaxial growth of the thin film layer sequence on the growth substrate, wherein the second planar surface of the semiconductor body is remote from the growth substrate; and
    forming at least the first mirror area from the second planar surface by removing semiconductor material from the thin film layer sequence.

12. The method as claimed in claim 11, wherein the carrier substrate is applied to the second planar surface, and wherein the growth substrate is separated from the active region.

13. The method as claimed in claim 11, wherein the surface emitting thin film semiconductor laser is produced in a wafer assemblage, and wherein the thin film semiconductor laser is detached from the wafer assemblage after the carrier substrate has been applied.

14. The method as claimed in claim 12, wherein, before the carrier substrate is applied, at least the second electrode is applied to the second planar surface of the semiconductor body.

15. The method as claimed in claim 12, wherein before the growth of the thin film layer sequence, the radiation reactive layer is applied to the growth substrate by epitaxial growth;
    the current spreading layer is applied to the radiation reactive layer;
    the thin film layer sequence is formed by epitaxial growth on the current spreading layer;
    after the removal of the growth substrate, the radiation reactive layer is removed outside the region provided for the third monitor electrode;
    outside the radiation reactive layer, the first electrode is formed on the functional layer; and
    the third monitor electrode is formed on the radiation reactive layer.

16. The semiconductor laser as claimed in claim 1, wherein a thickness of the semiconductor laser is 20 µm or less.

17. The semiconductor laser as claimed in claim 1, wherein the semiconductor body includes, for coupling out radiation from the at least one active layer toward the first planar surface, a second mirror area inclined with respect to the at least one active layer;
    wherein the passivated first mirror and second mirror areas are totally reflecting mesa flanks of the semiconductor body;
    wherein the second planar surface and the radiation-generating region are disrupted by the mesa flanks of the semiconductor body; and
    wherein the first planar surface extends over at least one portion of the at least one active layer, said at least one portion of the at least one active layer being located in prolongation of a connecting line that extends from the passivated first mirror area to the second mirror area.

18. The semiconductor laser as claimed in claim 1, wherein the at least one passivated first mirror is passivated by removing oxygen from its surface.

19. The semiconductor laser as claimed in claim 1, wherein the at least one passivated first mirror is passivated by removing oxygen from its surface by hydrocleaning.

20. A semiconductor laser which is embodied as a surface emitting thin-film semiconductor laser with a semiconductor body, comprising:
    a first and a second planar surface;
    an epitaxially grown thin-film layer sequence with at least one active layer between the first and second planar surfaces, the active layer comprising a radiation-generating region;
    at least one passivated first mirror area inclined with respect to the at least one active layer for coupling out radiation from the at least one active layer toward the first planar surface; and
    a first electrode applied on the first planar surface and a second electrode applied on the second planar surface, said first and second electrodes being in direct contact with the thin-film layer sequence;
    wherein the first and the second electrodes comprise at least one metal or at least one metal alloy;
    wherein the semiconductor laser is free of a growth substrate in the thin-film layer sequence;
    wherein the semiconductor body includes, for coupling out radiation from the at least one active layer toward the first planar surface, a second mirror area inclined with respect to the at least one active layer;
    wherein the passivated first mirror and second mirror areas are totally reflecting mesa flanks of the semiconductor body;
    wherein the second planar surface and the radiation-generating region are disrupted by the mesa flanks of the semiconductor body; and
    wherein the first planar surface extends over at least one portion of the at least one active layer, said at least one portion of the at least one active layer being located in prolongation of a connecting line that extends from the passivated first mirror area to the second mirror area and said at least one portion being free of electrodes.

* * * * *